United States Patent [19]
Katz et al.

[11] Patent Number: 5,642,427
[45] Date of Patent: *Jun. 24, 1997

[54] INTEGRATED CIRCUIT FOR AUDIO ENHANCEMENT SYSTEM

[75] Inventors: Joel Katz, Ruxton, Md.; Miles Kath, Wilmington, N.C.

[73] Assignee: HDA Entertainment, Inc., Timonium, Md.

[*] Notice: The portion of the term of this patent subsequent to Jun. 25, 2013, has been disclaimed.

[21] Appl. No.: 420,365

[22] Filed: Apr. 11, 1995

Related U.S. Application Data

[63] Continuation of Ser. No. 81,209, Jun. 25, 1993, Pat. No. 5,425,106.
[51] Int. Cl.⁶ .................................................. H03H 11/18
[52] U.S. Cl. ............................... 381/97; 381/17; 381/61
[58] Field of Search ........................................ 381/17, 97

[56] References Cited

U.S. PATENT DOCUMENTS 5,425,106  6/1995  Katz et al. ................... 381/97

OTHER PUBLICATIONS

National Semiconductor LM-324, from p. 3-142 of National Semiconductor's Linear Data Book, Jun. 1976.

Primary Examiner—Forester W. Isen
Attorney, Agent, or Firm—Michael de Angeli

[57] ABSTRACT

An integrated circuit for use as a building block in different embodiments of systems for enhancing audio performance by providing group delay to various frequency components of the signal. The integrated circuit includes four op amps and associated circuitry. Using external connections, the device can be configured as a two-channel stereo device, or can be cascaded for monaural applications. Two of the chips may be cascaded together for stereo applications. External capacitances and resistances are used to control the degree of group delay provided to the signal to realize desired audio enhancement.

9 Claims, 5 Drawing Sheets

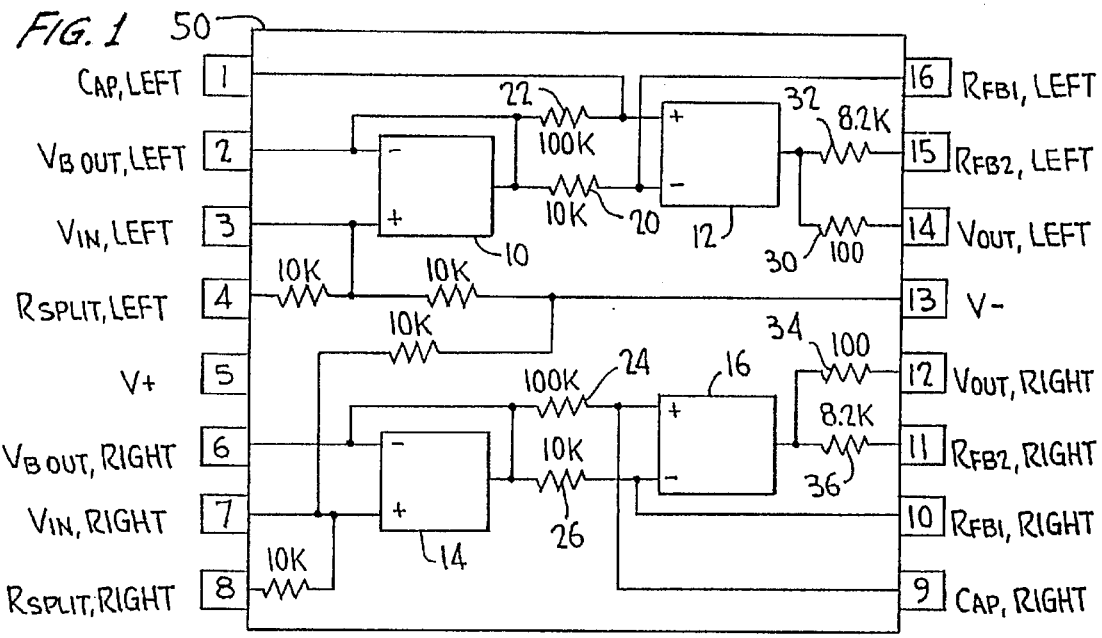
FIG. 1
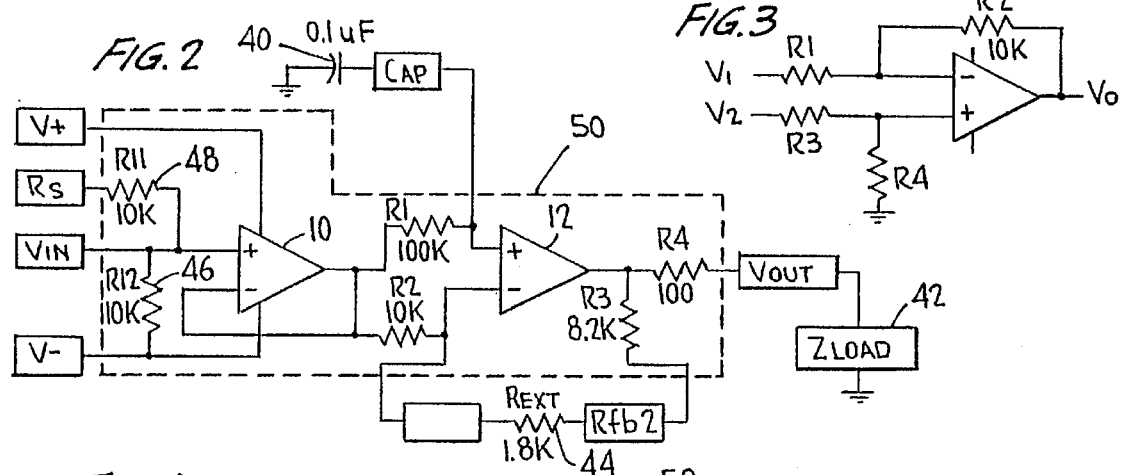
FIG. 2
FIG. 3
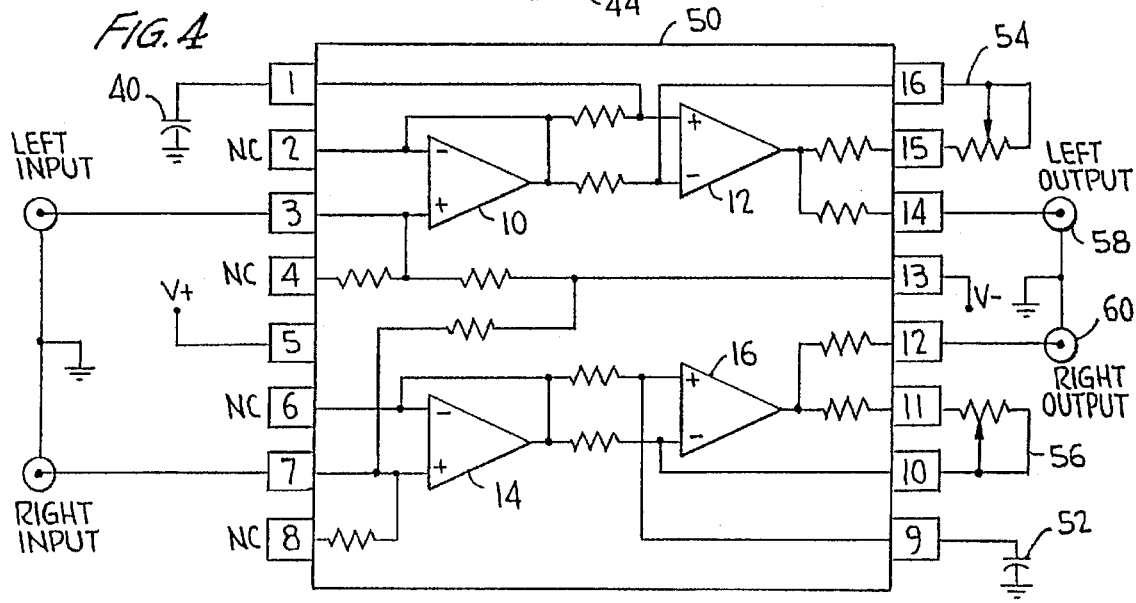
FIG. 4

INTEGRATED CIRCUIT FOR AUDIO ENHANCEMENT SYSTEM

This is a continuation of application Ser. No. 08/081,209 filed Jun. 25, 1993, now U.S. Pat. No. 5,425,106.

FIELD OF THE INVENTION

This invention relates to systems and methods for enhancing audio reproduction, e.g., for music reproduction and the like. More particularly, this application relates to an integrated circuit useful as a building block in several different circuit configurations for audio enhancement.

BACKGROUND OF THE INVENTION

Over the years there have been many attempts to improve the quality of reproduction of recorded sound, particularly music. The bulk of this work has been directed to improvements in the signal-to-noise ratio of sound recordings and reproduction equipment, reduction of "wow and flutter" in mechanical reproduction systems, and the like. There has also been substantial work directed toward enhancement of the sound of audio recordings. Specifically, it has been an object of numerous inventors over the years to enhance reproduced audio in order to provide a more "live" sound in reproduced music, to improve the listening experience in an aesthetically pleasing way.

International Patent Application No. PCT/US91/09375 in the name of Eldon Byrd provides an extensive discussion of various systems designed to thus enhance the aesthetic qualities of reproduced audio. Byrd claims a system having first and second signal processing stages wherein additional harmonic frequencies related to fundamental frequencies in the audio signal are phase shifted as a function of frequency, such that the phase shift increases in a negative direction with increasing frequency, that is, so that the higher frequency signals lag the lower frequency signals.

Additional documents relating to devices for improving the aesthetic qualities of reproduced music include U.S. Pat. No. 4,841,572 to Klayman, broadly disclosing a system for simulating stereo sound in a monaural system. Klayman teaches splitting the input signal and delaying one portion thereof by a 90° phase separation, so that one of the two signals is time delayed by an amount varying with the frequency of each portion of the delayed signal. Klayman suggests that only signal information below about 10 KHz is relevant to operation of the system.

Another system of interest is shown in Tominari U.S. Pat. No. 4,873,722, wherein an audio signal is supplied to loudspeakers in the normal way together with a second signal comprising the main channel signal having been phase delayed according to a frequency versus delay time characteristic such that the lower frequencies are delayed more than the higher frequency components.

Another prior art system for increasing the aesthetic qualities of recorded sound is shown in U.S. Pat. No. 3,924,072 to Turner et al, wherein a monaural signal is played through one of a pair of speakers while the same signal is phase-inverted and played through the second speaker of the pair, so as to provide audible information responsive to the phase difference between the two channels.

It is also known to play the main audio signal through front and rear pairs of speakers in a listening room, wherein the signal played through the rear pair of speakers is time-delayed so as to simulate an echo of the signal from the rear of a concert hall or other listening room. Systems are known which provide variable time delay to simulate listening rooms of various sizes, and also in which the reflectivity of various types of listening rooms are effectively simulated.

Further generally relevant disclosures are found in U.S. Pat. Nos. 3,983,334 to Takahashi et al; 4,495,637 to Bruney; 4,887,045 to Nakayama; 4,567,607 to Bruney et al; 4,831,652 to Anderson et al; 4,817,162 to Kihara; 4,706,287 to Blackmer et al; and 4,908,858 to Ohno.

The prior art has also failed to provide circuitry in a sufficiently convenient and inexpensive form to permit the same circuit components to be used for audio enhancement in a number of different applications.

OBJECTS AND SUMMARY OF THE INVENTION

It is therefore an object of the invention to provide an improved system for enhancement of the aesthetic qualities of reproduced audio, particularly music.

It is a further object of the invention to provide an integrated circuit for use as a building block in audio enhancement processor devices whereby the same basic integrated circuit can be used in a monaural, cascaded monaural, stereo or cascaded stereo configuration at minimal cost and with minimal external components, such that audio enhancement devices can be made readily and economically available, and so that the same integrated circuit can be employed for sound enhancement in numerous different applications, including recording studios, broadcast studios, and home and mobile audio systems.

It is a further object of the invention to provide an integrated circuit for use in audio enhancement systems, wherein a group delay is applied to the audio signal to be enhanced, whereby the individual frequency components of the audio signal are delayed in substantially an inverse-square relationship to their frequency.

It has been found by the present inventors that the various approaches to enhancement of recorded audio material represented by the above prior art disclosures can be further improved. More specifically, the present inventors have found that superior results may be obtained by mixing the individual frequency components of the input audio signal under appropriate processing conditions such that various sum and difference components are obtained. Preferably, this is done in a system whereby the additional signals thus produced are added to the input signal with a group phase delay, such that the additional signals resulting from the sum and difference mixing are heard by the listener some little time after the input signal, that is, are delayed with respect to the portion of the input signal from which the sum and difference signals are derived.

More specifically, the group delay imparted to the audio signal should be substantially an inverse-square function of the frequency of the various components of the input signal. In a particularly desirable embodiment, the inverse square group delay function is effectively reduced to a logarithmic function of the various frequency components of an input audio signal to be thus enhanced.

The above needs of the art and objects of the invention are satisfied by the present invention, which comprises an integrated circuit having at least one identical pair of two non-linear circuit components in which the various components of the input signal are effectively mixed to provide a multitude of sum-and-difference audio enhancing signals heard together with the input signal. Typically the non-linear devices are operational amplifiers (hereinafter op amps). In a preferred embodiment, a first op amp of each pair is employed as a buffer, and the second as an all-pass filter. The input signal is connected to the non-inverting input of the first op amp. The output of the first op amp is supplied to the non-inverting input of the second op amp and is also fed back to the inverting input of the first op amp in feedback configuration. Feedback is also provided between the output of the second op amp and its inverting input. A capacitor C external to the integrated circuit is provided between the non-inverting input of the second op amp and ground, and a resistance R is provided in a signal path between the output of the first op amp and the non-inverting input of the second op amp. The quantity 1/RC is defined as $\alpha_o$, and the group delay $T_{gd}$ is an inverse-square function of $\alpha_o$. The capacitor C may be provided external to the integrated circuit, as noted, for adjustment of the group delay provided; alternatively or additionally, the feedback resistance R in the feedback loop of the second op amp can be provided external to the chip for adjusting the group delay. Further, an external adjustable resistance may be provided for adjusting the overall circuit gain.

Without intending to limit the scope of the claims of this application in any way, it is thought that possibly the improved aesthetic effects provided according to the invention are realized for the following reasons. As noted, according to the invention, various frequency components of the input audio signal to be enhanced are mixed with one another in the non-linear devices, such that the output signal includes components at frequencies equal to the sums and differences of the various components of the input signals, and while providing a group delay generally inversely proportional to the frequency. The effect is to provide a much "fuller" or "richer" sound. The effect on most listeners is not unlike listening to a live performance. Accordingly, it would appear possible that the mixing of the various frequency components corresponds to various constructive and destructive interferences of sound waves occurring upon reflection within a typical listening area. As noted, this explanation of the possible aesthetic appeal realized by the device according to the invention is not intended to limit the claims hereof.

BRIEF DESCRIPTION OF THE DRAWINGS

The invention will be better understood if reference is made to the accompanying drawings, in which:

FIG. 1 shows a block diagram of the basic integrated circuit provided according to the invention as a building block for use in sound enhancement circuitry;

FIG. 2 shows a schematic diagram of one of the pairs of op amps used in tandem in the circuit of FIG. 1;

FIG. 3 shows differential amplifier circuitry useful in explanation of the operation of the circuit of the invention;

FIG. 4 shows typical external connections made to the circuit of FIG. 1 to provide stereo enhancement;

DESCRIPTION OF THE PREFERRED EMBODIMENTS

Figure 5:
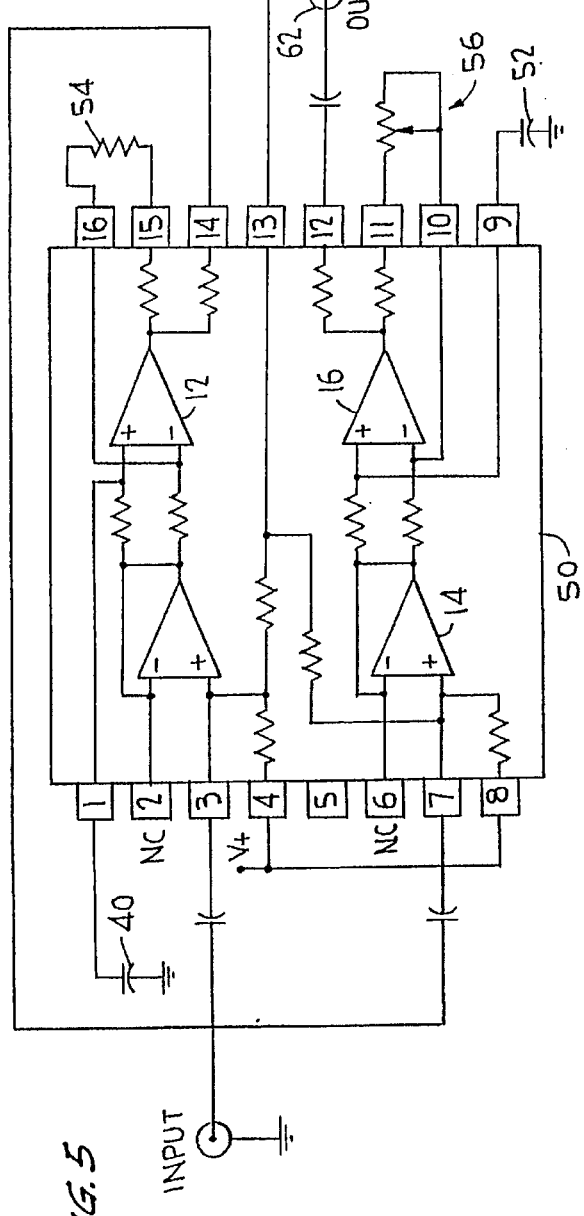
FIG. 5 shows how the basic circuit of FIG. 1 may be connected to provide cascaded monaural audio enhancement.
Figure 6:
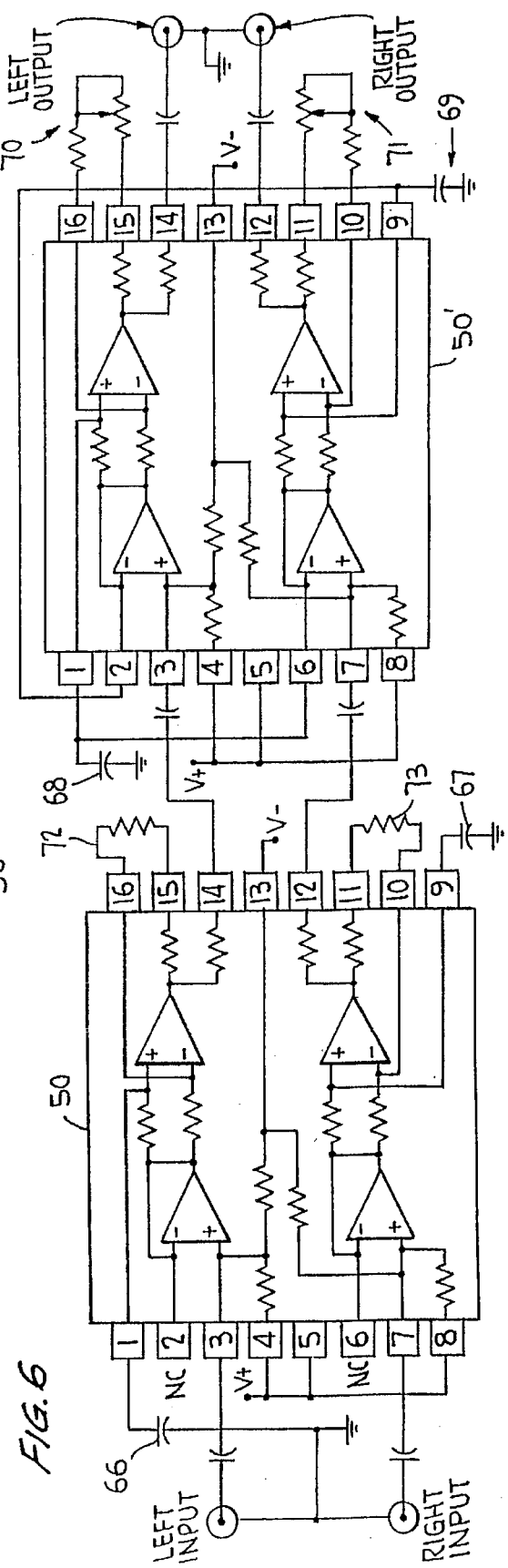
FIG. 6 shows how two of the circuits of FIG. 1 can be operated to provide cascaded stereo enhancement.

As indicated above, FIG. 1 shows in block diagram form the components of the integrated circuit "chip" 50 according to the invention, as may be employed as a building block for a wide variety of audio enhancement applications. FIG. 1 shows the specific "pinouts", that is, the external connection points, of the chip 50; the same pinouts are used in FIGS. 4, 5, and 6, giving specific examples of the use of the chip. Although the depiction of chip 50 provided in FIGS. 4, 5, and 6 is simplified, the circuit is the same in each of these Figures.

Thus, as shown in FIG. 1 the basic chip 50 has sixteen input/output pins numbered as shown. The essential elements of the circuit are two pairs of non-linear devices. In the preferred embodiment, the non-linear devices are op-amps, each having an inverting input terminal denoted by a negative sign (−), a non-inverting input terminal denoted by a positive sign (+), and an output terminal. The op amps are arranged and operated in two pairs, the first pair being denominated 10 and 12 and the second pair being denominated 14 and 16. The first op amp of each pair, that is, op amps 10 and 14, serves as a buffer, while the second op amp 12 and 16 of each pair serves as an all-pass filter, as described in further detail below. Commonly, the system is used in a left channel/right channel "stereo" configuration, shown in FIG. 4, in which op amps 10 and 12 employed to enhance the left channel signal and op amps 14 and 16 are employed to enhance the right channel signal, corresponding to the labels placed on the pins in FIG. 1. (As detailed below in connection with FIG. 5, all four of the op amps on the chip 50 can be used in a monaural cascaded application.) Thus, the left input signal ($V_{in}$, left) is applied at pin 3 to the non-inverting input of op amp 10. The output of op amp 10 is fed back to the inverting input thereof, connected to pin 2, and is also applied via a resistor 20 to the inverting input of the second op amp 12, and via a larger-valued resistor 22 to the non-inverting input, as indicated. An external capacitor may be connected via pin 1 to the non-inverting input of the op amp 12. As detailed below, the value C of this capacitor can be chosen in order to control the parameter $\alpha_o$ which, in turn, controls the group delay provided to the audio signal according to the invention. The output of the second op amp 12 is applied to pin 14 via a low-valued resistor 32 and is also applied to pin 15 via a higher-valued resistor 30. An external feedback resistor is connected between pins 15 and 16 to complete the feedback path of op amp 12.

Essentially the same circuitry is provided for the right channel signal, as indicated in the lower portion of FIG. 1. The right input signal ($V_{in}$, right) is applied via pin 7 to the non-inverting input of op amp 14. The output of op amp 14 is fed back to the inverting input thereof, and is also connected via a high-valued resistor 24 to the non-inverting input of op amp 16, and through a lower-valued resistor 26 to the inverting input of op amp 16. The output of op amp 16 is fed to pin 12 via a low-valued resistor 34, and also to pin 11 via a higher-valued resistor 36. An external capacitor may be connected to the non-inverting input of op amp 16 via pin 9 for the same reasons mentioned above. The feedback path of op amp 16 is completed by an external resistor connected between pins 10 and 11.

The other pin-out connections shown provide power to the op amps, V+ being applied at pin 5, and V− at pin 13. Buffered inputs are taken out at pins 2 and 6 with respect to op amps 10 and 14, respectively. Pins 4 and 8 are provided for connection of a voltage divider needed if a monopolar power source—such as in automotive applications—is to be employed. Values for the resistances internal to the chip in one preferred embodiment of the invention are given in FIG. 1, and these resistance values were used to derive the simulation results provided below. However, it will be understood that these values are not intended to limit the invention being claimed.

FIG. 2 shows a detailed schematic of one of the pairs of op amps as typically connected for audio enhancement. The circuit shown in FIG. 2 corresponds to the block-diagram circuit in the upper half of FIG. 1, such that the op amps 10 and 12 are commonly numbered in FIGS. 1 and 2, while resistors R1 and R2 of FIG. 2 correspond to resistors 22 and 20 of FIG. 1, respectively. Further, output resistor R4 in FIG. 2 corresponds to resistor 30 in FIG. 1, and internal feedback resistor R3 in FIG. 2 corresponds to resistor 32 in FIG. 1. As shown, an external resistor 44 completes the feedback loop around the second op amp 12. In this configuration an external capacitor 40 of 0.1 µf is connected to the non-inverting input of op amp 12. The load 42 is connected to the output of op amp 12 via R4. Resistor R12 is provided between V− and the non-inverting input of the first op amp 10, as indicated at 46, and a second resistance R11 is provided between pin 4 and the non-inverting input of op amp as indicated at 48, again, to allow use of a monopolar power supply.

Thus, as indicated in FIG. 1, the basic integrated circuit 50 comprises 4 op amps. These may be thought of as analog computers mixing the various frequency components of the audio signal to be enhanced. The user need only provide external capacitors, resistors and potentiometers and appropriate interstage coupling jumpers to use the basic "building block" integrated circuit shown in FIG. 1 and detailed in FIG. 2 to provide a variety of functions as disclosed below.

The provision of the external capacitor 40 connected to the non-inverting input as indicated in FIG. 2 allows the second op amp 12 to act as a "first order active all-pass filter" or APF. The analysis of the all-pass filter can be viewed from the perspective of a differential amplifier as indicated in FIG. 3. The basic equation for the differential amplifier is as follows:

$$V_o = \frac{R_1 + R_2}{R_3 + R_4} \cdot \frac{R_4}{R_1} V_2 - \frac{R_2}{R_1} V_1 \qquad (1)$$

with $V_O$, $V_1$, $V_2$, and $R_{1-4}$ as identified in FIG. 3.

Now, if the two inputs are tied together and the negative feedback is set to unity, we can reduce the equation as follows:

Let $V_2 = V_1 = V_I$
and
Let $R_2 = R_1$ $$\rightarrow \frac{V_o}{V_I} = \frac{2R_4}{(R_3 + R_4)} - 1$$

$$\frac{V_o}{V_I} = \frac{(R_4 - R_3)}{(R_4 + R_3)}$$

Replacing R4 with a capacitor, such that the device behaves as an all-pass filter, implementing a group delay function as discussed below, and rewriting the transfer function:

Let $R_3 = R$
and
replace $R_4$ with $\frac{1}{SC}$:

$$\rightarrow \frac{V_o(S)}{V_I(S)} = T(S) = \frac{\left(\frac{1}{SC} - R\right)}{\left(\frac{1}{SC} + R\right)}$$

Rearranging terms yields:

$$T(s) = -\frac{(s - \alpha_o)}{(s + \alpha_o)}$$

where:

$$\alpha_o = \frac{1}{RC}$$

This is the Phase-Lead version of the All-Pass response. Its characteristics are as follows:

For S=jw, the Magnitude is given by:

$$|T(jw)| = -\frac{|\alpha_o - j\omega|}{|\alpha_o + j\omega|} = -\frac{\sqrt{\alpha_o^2 + \omega^2}}{\sqrt{\alpha_o^2 + \omega^2}} = -1$$

The phase shift β is given by:

$$\beta(\omega) = -2 \tan^{-1} \frac{2\omega}{\alpha_o}$$

Such that:

$$\beta (DC)=0°, \beta (\alpha_o)=90°, \beta^{(\infty)}=180°$$

and the Group Delay is:

$$T_{gd} = -\frac{d\beta(\omega)}{d\omega} = \frac{2\alpha_o}{\alpha_o^2 + \omega^2} \qquad (3)$$

Thus, $\alpha_o$ is a function of the external capacitance C. Accordingly, the value of C can be controlled to select the desired group delay $T_{gd}$.

Note that the gain is unity, and the phase response is highly regular. The most interesting characteristic is the Group Delay $T_{gd}$. The Group Delay is derived from phase delay, which is defined as the phase shift in a system at a given frequency. Group Delay is associated with a group of frequencies around a central carrier, such as those encountered in modulated communications, but it also finds relevance in describing how a system responds to a change in frequency.

It will be observed that equation (3) above for the group delay follows an inverse square-law. The value of $T_{gd}$ is fixed for DC but it approaches a finite value (near zero) at infinity. The value of $T_{gd}$ is effectively limited by the propagation through the op amps. For a given region, this square-law response can be approximated by a logarithmic function; given the appropriate values for the resistor and capacitor, this logarithmic response will appear across the audio range.

More specifically, equation (3) can be expanded using a Taylor series to yield the following expression for $T_{gd}$ where $\omega \approx \alpha_o$:

$$T_{gd}(\omega \approx \alpha_o) \approx \frac{2.3}{\alpha_o} \log\left(\frac{\alpha_o}{\omega}\right) \qquad (4)$$

Thus, it can be seen that the group delay response of the system described above is described by an inverse-square function of the frequency of the input audio signal, meaning that as the frequency increases the group delay is reduced. Thus, lower frequency signals are delayed more than higher frequency signals. Moreover, in the area where ω is roughly equal to $\alpha_o$, this inverse square response is essentially logarithmic in nature. Typical values for R and C are selected such that $\alpha_o \approx 100$ Hz.

As indicated above, it is generally the understanding of the inventors that the group delay response thus described and illustrated mathematically provides the pleasing audio enhancement noticed in use of the device described. As described above, the effect of using op amps in the configuration shown is to mix various frequency components of the incoming signal. This mixing of signals at various frequencies in non-linear devices yields sum-and-difference signals as well understood in the art. It is believed that these signals may correspond effectively to various combinations of reflected sound as experienced in a relatively small listening room, which is responsible for the very "live" or "present" sound of audio enhanced according to the invention.

FIG. 4 shows how the basic integrated circuit 50 can be connected using external wiring in a simple stereo application. That is, when connected as shown in FIG. 4, the basic chip 50 is adapted to provide group delay for audio signal enhancement to both channels of a two-channel stereophonic system. Thus, a left input signal is connected to input pin 3 connected to the noninverting input of buffer op amp 10 of the left channel, while the right input signal is similarly connected via pin 7 to the noninverting input of buffer op amp 14 of the right channel. An external capacitor 40 is connected via pin 1 to the noninverting input of the all-pass filter op amp 12 of the left channel, and similarly an external capacitor 52 is connected via pin 9 to the noninverting input of all-pass filter op amp 16 of the right channel. External feedback potentiometers are provided at 54 and 56 for adjusting the degree of feedback in the left and right all-pass filter op amps 12 and 16, as shown. The outputs of the op amps 12 and 16 are provided at output jacks 58 and 60 for the left and right channels as shown. Thus, in the embodiment of FIG. 4 the chip 50 is employed to provide audio enhancement according to the invention to both channels of a stereophonic system.

FIG. 5 shows a different use of the same basic chip 50 wherein the group delayed audio signal from a first channel is fed into the second channel and group delayed again, such that a "cascaded monaural" effect is obtained. Thus, the single input signal is received at pin 3 of the upper channel and supplied to the noninverting input of op amp 10, the output of which is fed to both inputs of the all-pass filter op amp 12 through differential resistances as discussed above in connection with FIG. 1. The output of all-pass op amp 12 is connected via pin 14 to the input pin 7 of the buffer op amp 14 of the lower channel, the output of which is again fed to both inputs of the all-pass filter op amp 16 of the lower channel. In this embodiment a fixed resistor 54 is connected in the feedback loop of the upper op amp 12 via pins 15 and 16, while a potentiometer 56 is provided between pins 10 and 11 of the lower op amp 16 for control of the overall circuit gain. An external capacitance 40 is provided at pin 1 connected to the noninverting input of op amp 12 and a second external capacitance 52 is provided via pin 9 to the noninverting input of op amp 16, determining C in the RC term defining $\alpha_o$ of the two channels, respectively, and thus determining the overall group delay provided to the input signal. If it is desired to operate the device from a monopolar supply, such as in automotive applications, input and output capacitors may be provided in the circuit, as shown, to eliminate dc offset bias caused by use of a monopolar supply.

FIG. 6 shows a further embodiment of the invention wherein two identical chips 50 and 50' may be connected as shown such that each of two stereo channels are cascaded as in connection with the monaural application of FIG. 5. Thus, the output from pin 14 of the first chip 50 is fed to the input of pin 3 of the second chip 50'; similarly, the output from pin 12 is fed to the input pin 7 of the second chip. Fixed resistances 72 and 73 are provided in the feedback loops of the all-pass filter op amps of the first chip 50, while potentiometers 70 and 71 are provided in the feedback loops of the all-pass filter op amps of the second chip 50'. External capacitances 66–69 are provided at pins 1 and 9 of the two chips to provide C in the RC term controlling the value of $\alpha_o$, the group delay parameter. Capacitors are provided on the inputs and on the outputs, to allow operation from a monopolar source, as above, and between the stages, to eliminate dc bias between the stages.

As noted, FIGS. 7–12 show results of simulation of circuits designed to implement the invention, and illustrate desired characteristics as described below.

Figure 7:
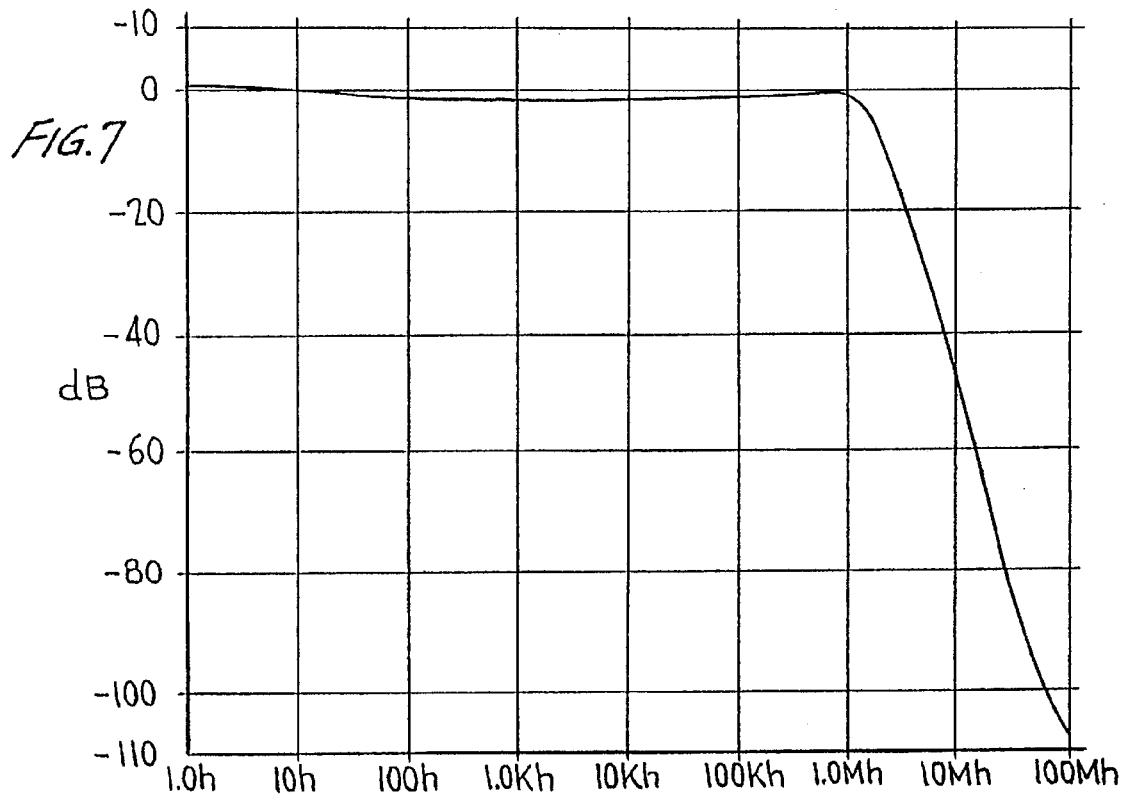
FIGS. 7 through 12 show results of simulations illustrating the performance of the circuitry.

FIG. 7 shows the response of the op amps used in the basic integrated circuit chip in dB on the vertical axis versus frequency in Hz on the horizontal axis. As can be seen the response is essentially flat out to nearly 1 MHz. It is believed that this flat high frequency response is important for the practice of the invention, in that very high frequency components of the signals are developed through mixing of the various frequency components; it is believed that these high frequency components (although not directly heard, of course) have a substantially beneficial effect on the effect as perceived by the listener.

Figure 8:
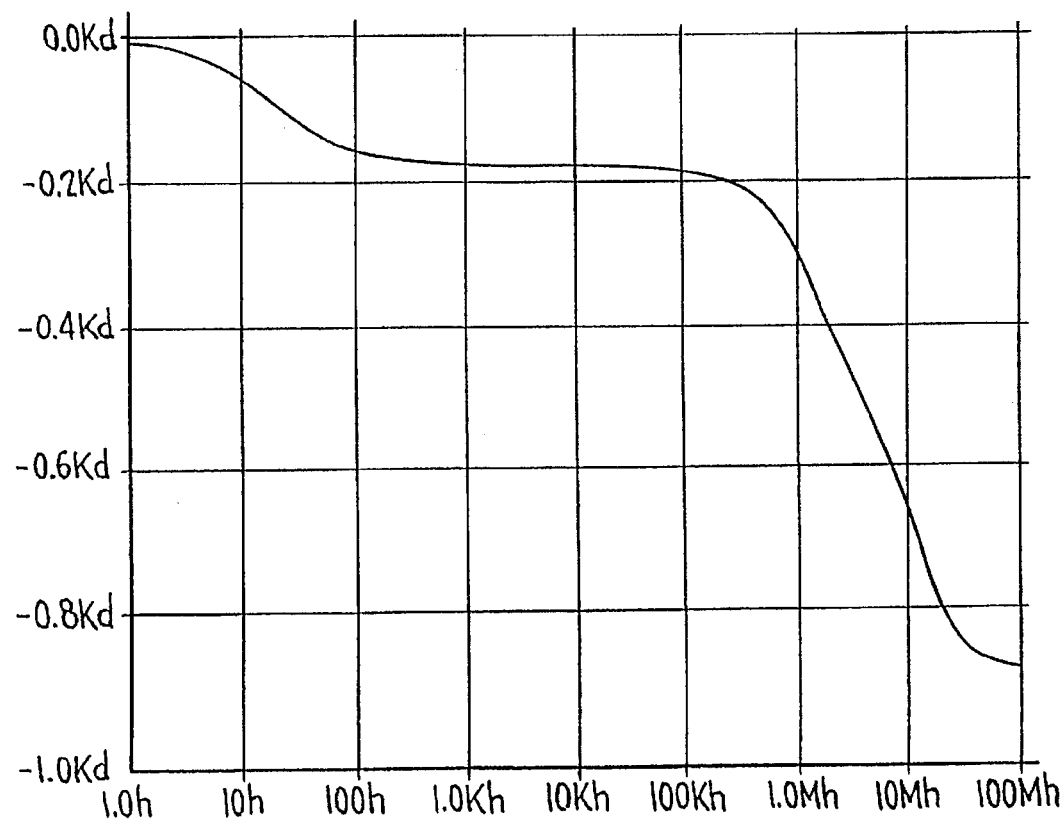

FIG. 8 shows the phase response of the op amps in the basic chip in units of thousands of degrees of group delay versus frequency. For example, between about 100 Hz and about 10 KHz approximately 200° of group delay is provided. As can be seen the phase response is essentially flat between about 100 Hz and about 100 KHz, but drops off between 1 Hz and 100 Hz. Thus, somewhat less group delay is added to the signal below 100 Hz, after which the group delay is essentially flat in the audible range, and then increases further above 100 KHz as shown. Again, without limiting the scope of the invention claimed, this circuit characteristic is believed to be beneficial in terms of the audible results.

Figure 9:
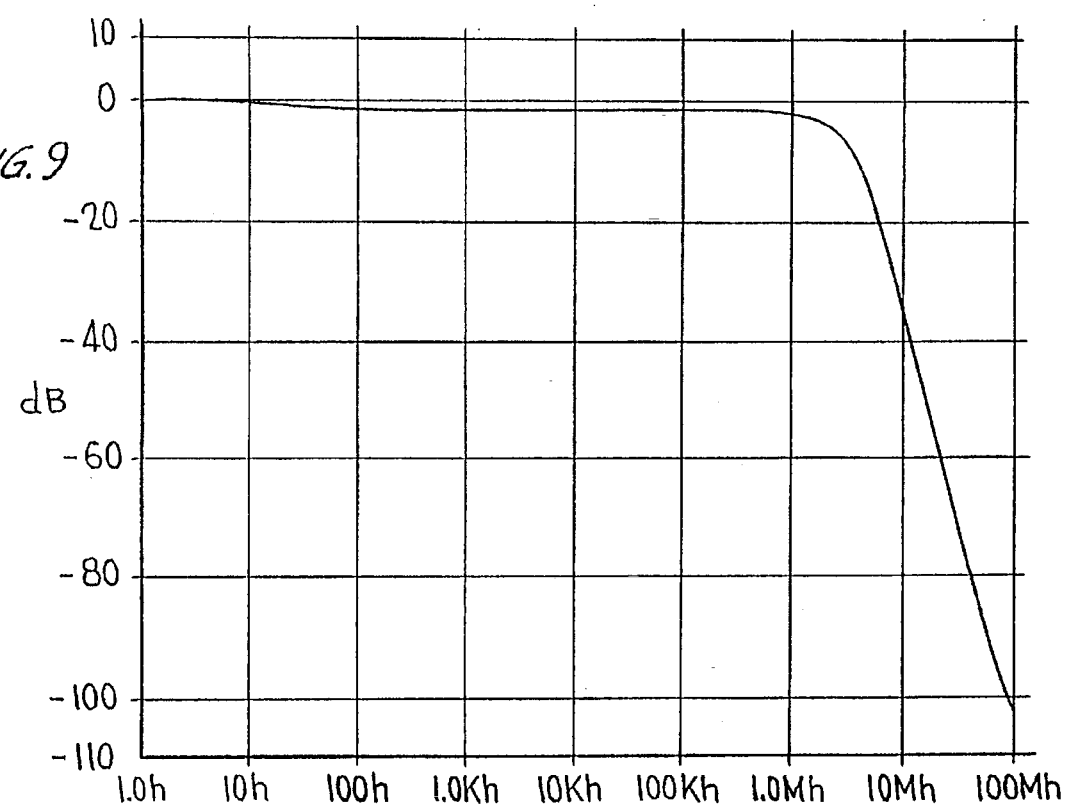

FIG. 9 shows the output gain in dB as a function of frequency and illustrates that the system provides an essentially flat response up to about 1 MHz, as is believed desirable.

Figure 10:
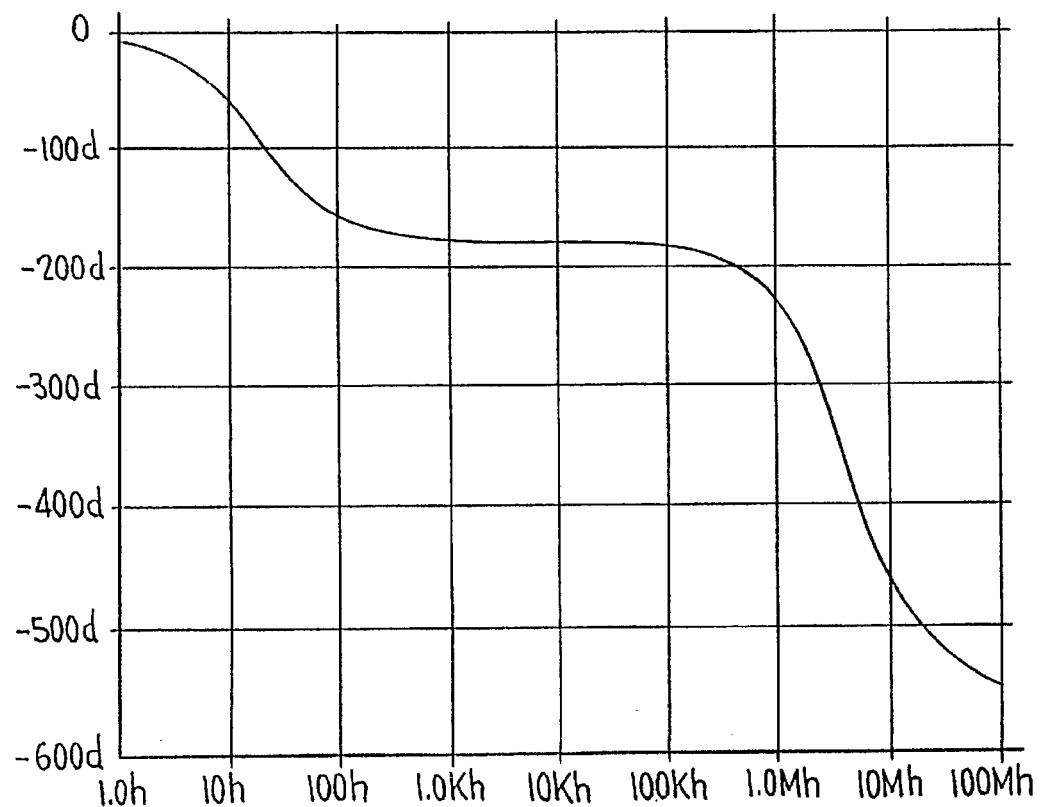

FIG. 10 shows the output phase response of the circuit, in units of hundreds of degrees of phase shift versus frequency, and again shows that the response is essentially flat between about 100 Hz and about 100 KHz, as is considered to be desirable.

Figure 11:
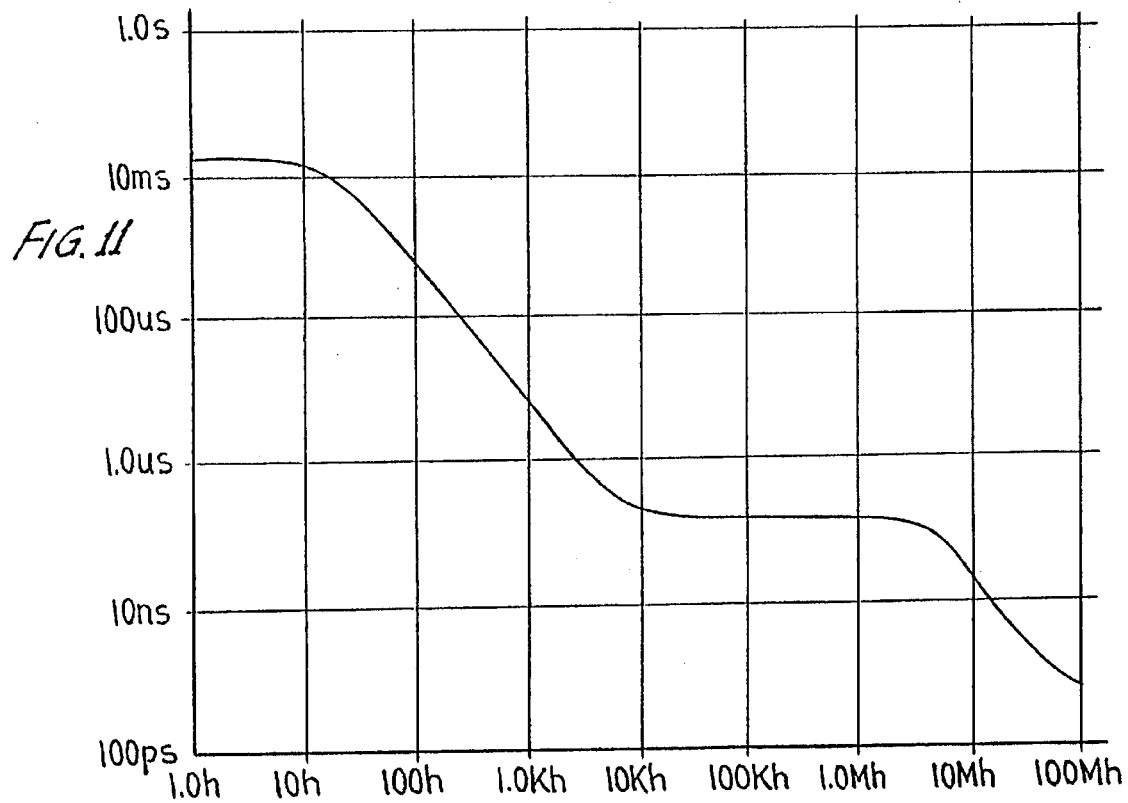

FIG. 11 shows the output group delay of the circuit in units of time versus frequency, and shows that the group delay drops from 10 milliseconds at about 15 Hz smoothly to about five nanoseconds at 10 KHz and is thereafter flat out past 1 MHz, indicating that the actual delay increases with frequency in a smooth and predictable fashion. Again, without limiting the invention, this circuit performance is believed to contribute to the desirable auditory results experienced by listeners experimenting with the system of the present invention.

Figure 12:
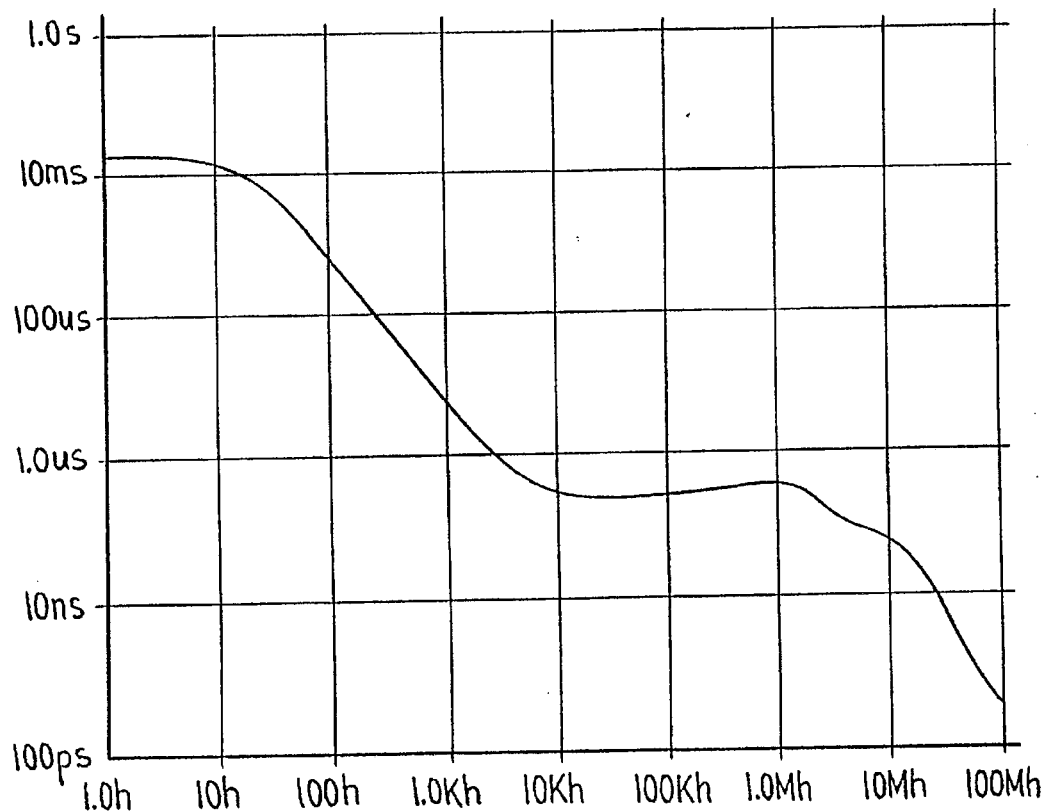

Finally, FIG. 12 shows the output group delay response of the op amps as time versus frequency, and indicates a result essentially as above, i.e., that the group delay response drops smoothly between about 15 Hz and about 10 KHz and is thereafter essentially flat out to about 1 MHz.

It will be appreciated further by those of skill in the art that by use of external circuitry the integrated circuit of the present invention can be used in traditional op amp applications such as an inverter having adjustable gain, or as a low pass or high pass filter. Such uses of the invention are deemed to be within the following claims where not specifically excluded.

As discussed extensively above, the preferred mode of practice of the present invention is by way of a custom "building block" integrated circuit having four op amps integrated in a single chip and adapted by connection to its various input/output pins for configuring the integrated circuit to perform any of several distinct functions. The best mode of practice of the invention is by using state of the art op amp technology to form the op amps and associated circuitry shown on the chip. This is a well-developed art, such that no specific additional teachings will be required in addition to the present disclosure in order to enable practice of the invention. However, it should be appreciated that in order to obtain the high frequency response shown in the graphs of FIGS. 7–12, the slew rate and effective switching times of the op amps provided must be as fast as possible given current technology.

While a preferred embodiment of the invention has been shown and described in detail, this is not to be considered a limitation of the invention but merely as illustrative thereof; the invention is to be limited only by the claims which follow.

What is claimed is:

1. Apparatus for processing an audio signal so as to impart a group delay $T_{gd}$ to the components of said audio signal, comprising means for delaying lower-frequency components more than relatively higher-frequency components of said audio signal, comprising:

a first operational amplifier having said audio signal connected to a non-inverting input terminal thereof, and having its output terminal connected in a feedback loop to an inverting input terminal thereof;

a second operational amplifier having its non-inverting and inverting input terminals connected to the output terminal of said first operational amplifier through differential resistances;

wherein a capacitance C is connected between the non-inverting input terminal of said second operational amplifier and ground;

wherein said audio signal, having been processed by said first and second operational amplifiers, is provided to further processing or amplification stages by way of an output terminal of said second operational amplifier; and wherein said operational amplifiers and said differential resistances connected therebetween are provided on a single integrated-circuit chip, while said capacitance C is provided as an external, user-adjustable component, whereby the user may select the relative difference in the delay imparted to said higher-frequency components with respect to said lower-frequency components.

2. The apparatus of claim 1, wherein said group delay $T_{gd}$ is an inverse-square function of the frequency of the individual components of the audio signal.

3. The apparatus of claim 1, wherein said group delay $T_{gd}$ is described by the following:

$$T_{gd} = \frac{2\alpha_0}{\alpha_0^2 + \omega^2}$$

wherein:
    $\omega$ represents frequency components of the audio signal to be enhanced;
    R is the resistance between the output terminal of the first operational amplifier and the non-inverting input of the second operational amplifier; and
    $\alpha_o = 1/RC$.

4. The apparatus of claim 1, wherein said group delay $T_{gd}$ is a logarithmic function of the frequency of the individual components of the audio signal.

5. The apparatus of claim 4, where when $\omega \approx \alpha_o$, said logarithmic function is defined by:

$$T_{gd} \approx \frac{(2.3)}{\alpha_0} \log\left(\frac{\alpha_0}{\omega}\right)$$

wherein:
    $\omega$ represents frequency components of the audio signal to be enhanced;
    $\alpha_o = 1/RC$; and
    R is the resistance between the output terminal of the first operational amplifier and the non-inverting input of the second operational amplifier.

6. A method for constructing a building-block integrated circuit for use in several classes of audio enhancement processor devices, and for configuring said building-block circuit for use in a particular class of device, comprising the steps of:

forming an integrated circuit on a substrate, said integrated circuit defining at least two pairs of operational amplifiers, each having inverting and noninverting input terminals and an output terminal, and said integrated circuit further comprising:

first and second external input terminals connected to the noninverting input of a first operational amplifier of each of said pairs of operational amplifiers, respectively;

a conductor connecting the output terminal of the first operational amplifier of each pair to the noninverting input terminal of the second operational amplifier of that pair, with a resistance R interposed therebetween;

a conductor connecting the output terminal of the first operational amplifier of each pair to the inverting input terminal thereof, in feedback configuration;

a conductor connecting the output terminal of the second operational amplifier of each pair to the inverting input terminal thereof, in feedback configuration;

conductors connecting the output terminals of the second operational amplifier of each pair to first and second external output terminals, respectively; and conductors connecting non-inverting input terminals of the second operational amplifiers of each pair to first and second external capacitance terminals, respectively;

selecting the type and value of an external capacitance C in accordance with the intended use of a particular example of said integrated circuit in a particular class of device;

connecting an external capacitance C of the selected type and value between one or both of said first and second external capacitance terminals of said particular example of said integrated circuit and ground;

connecting the input terminal of the first pair of operational amplifiers to a source of an input signal to be processed;

connecting the output terminal of the second operational amplifier of said first pair to the input terminal connected to the noninverting input of the first operational amplifier of the second pair;

connecting the output terminal of the second operational amplifier of said first pair to a further amplification stage; and a buffer capacitor being interposed in the connection between the output terminal of the second operational amplifier of said first pair and the input terminal connected to the noninverting input of the first operational amplifier of the second pair.

7. The method of claim 6, comprising the further step of providing said external capacitance C as a variable capacitor, disposed to permit variation of C by a user to adjust the processing provided to said signals.

8. The method of claim 6, wherein a feedback resistor $R_{fb}$ is interposed in the connection between the output terminal of the second operational amplifier of each pair and the inverting input terminal thereof.

9. The method of claim 8, comprising the further step of providing said feedback resistor $R_{fb}$ as an external variable resistor, disposed to permit variation of $R_{fb}$ by a user to adjust the processing provided to said signals.

* * * * *